(12) United States Patent
Jiang et al.

(10) Patent No.: US 9,524,881 B2
(45) Date of Patent: Dec. 20, 2016

(54) METHOD FOR FABRICATING SPECIFIC TERMINATION ANGLES IN TITANIUM TUNGSTEN LAYERS

(71) Applicant: Texas Instruments Incorporated, Dallas, TX (US)

(72) Inventors: Neng Jiang, Plano, TX (US); Maciej Blasiak, Plano, TX (US); Nicholas S. Dellas, Dallas, TX (US); Brian E. Goodlin, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/700,937

(22) Filed: Apr. 30, 2015

(65) Prior Publication Data

US 2016/0322235 A1    Nov. 3, 2016

(51) Int. Cl.
*H01L 21/302* (2006.01)
*H01L 21/461* (2006.01)
*H01L 21/3213* (2006.01)
*H01L 21/3205* (2006.01)
*H01L 29/06* (2006.01)

(52) U.S. Cl.
CPC ... *H01L 21/32136* (2013.01); *H01L 21/32056* (2013.01); *H01L 21/32139* (2013.01); *H01L 29/0657* (2013.01)

(58) Field of Classification Search
CPC .......... H01L 21/32139; H01L 29/0657; H01L 21/32136; H01L 29/0661; H01L 29/7325; H01L 29/8613
See application file for complete search history.

(56) References Cited

U.S. PATENT DOCUMENTS 7,585,775 B1 * 9/2009 Bold ................. H01L 21/32136
438/706

* cited by examiner

*Primary Examiner* — Thomas L Dickey
*Assistant Examiner* — Damon Hillman
(74) *Attorney, Agent, or Firm* — Daniel Chan; Frank D. Cimino

(57) ABSTRACT

Method of forming a termination angle in a titanium tungsten layer include providing a titanium tungsten layer and applying a photo resist material to the titanium tungsten layer. The photo resist material is exposed under a defocus condition to generate a resist mask, wherein an edge of the exposed photo resist material corresponds to the sloped termination. The titanium tungsten layer is etched with an etching material, wherein the etching material at least partially etches the photo resist material exposed under the defocused condition, and wherein the etching results in the sloped termination in the titanium tungsten layer.

23 Claims, 5 Drawing Sheets

FIG. 2    FIG. 3

METHOD FOR FABRICATING SPECIFIC TERMINATION ANGLES IN TITANIUM TUNGSTEN LAYERS

BACKGROUND

Some components in integrated circuits have components fabricated from several layers including molybdenum (Mo), titanium tungsten (TiW), and aluminum nitride (AlN). One such device is a bulk acoustic wave (BAW) device that has a stack fabricated from layers of molybdenum, titanium tungsten, and aluminum nitride. The aluminum nitride forms an acoustic resonator with layers of molybdenum serving as electrical contacts or electrodes across the acoustic resonator. Layers of titanium tungsten and oxide are formed on each side of the acoustic resonator to form Bragg mirrors.

SUMMARY

A method of forming a termination angle in a titanium tungsten layer include providing a titanium tungsten layer and applying a photo resist material to the titanium tungsten layer. The photo resist material is exposed under a defocus condition to generate a resist mask, wherein an edge of the exposed photo resist material corresponds to the sloped termination. The titanium tungsten layer is etched with an etching material, wherein the etching material at least partially etches the photo resist material exposed under the defocused condition, and wherein the etching results in the sloped termination in the titanium tungsten layer.

DETAILED DESCRIPTION

Components fabricated onto integrated circuits by way of stacks having a plurality of layers, including titanium tungsten layers, are described herein. The prior art devices having titanium tungsten layers in the stacks are susceptible to cracking and seaming at the terminations of the titanium tungsten layers. For example, devices having titanium tungsten layers are susceptible to cracking or seaming where the titanium tungsten layers terminate at sharp or steep angles in the stacks. The sharp angles weaken the other materials in the stacks and enable cracks to form, which can spread though the stack. In some situations, the sharp angles enable seams or folds to form in the stacks, which also spread through the stack. Both the cracks and the seams can result in failure of the components in which the stacks are located. The devices and methods described herein reduce the angles at the terminations of the titanium tungsten layers, which reduces the possibility of cracks or seams forming in the stack.

Figure 1:
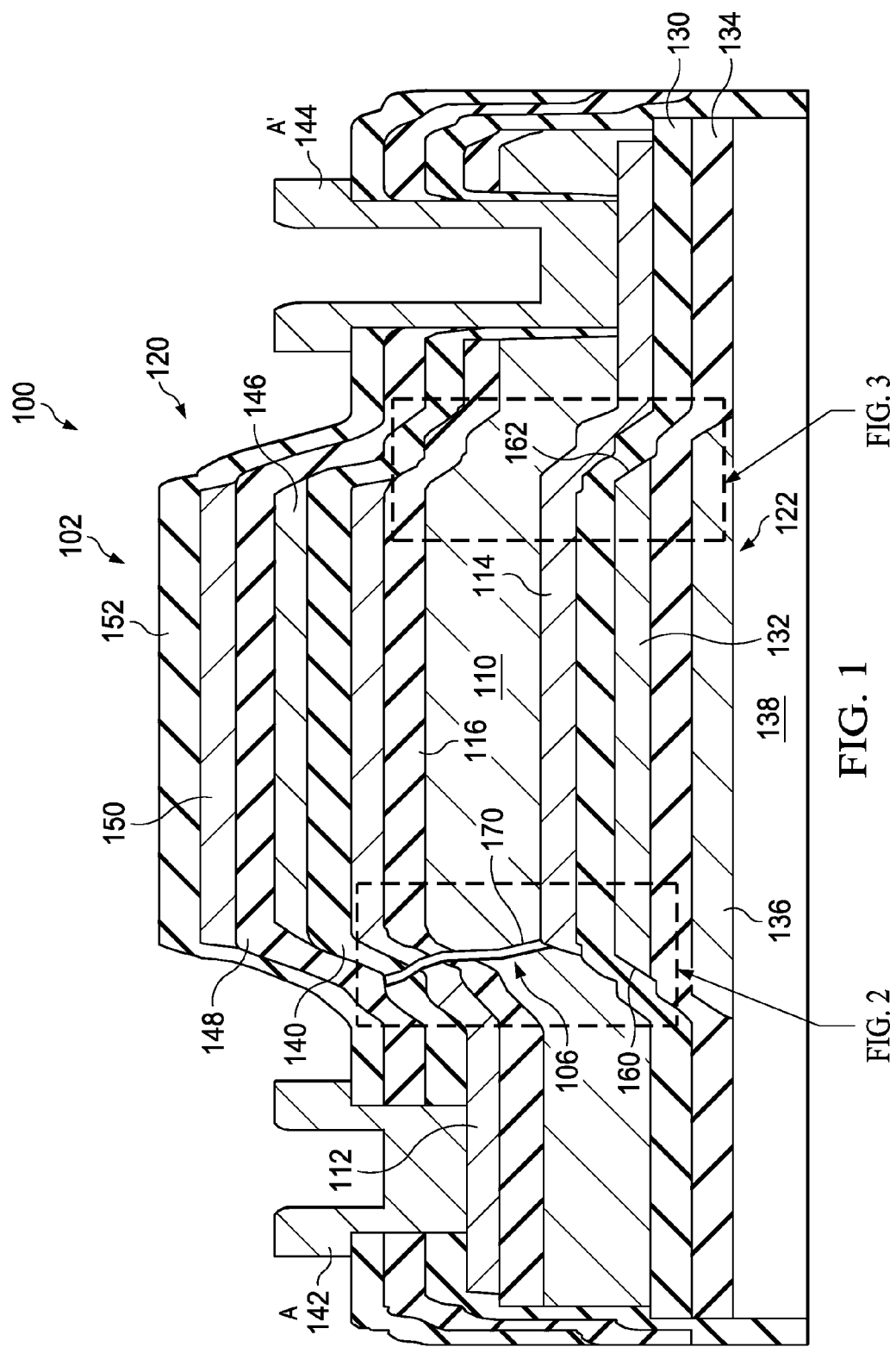
FIG. 1 is a side cutaway view of an aluminum nitride piezo based bulk acoustic wave device.

One example of a component fabricated with a stack having a plurality of layers is a bulk acoustic wave (BAW) device. FIG. 1 is an example of an aluminum nitride piezo-based (BAW) device 100 fabricated from a plurality of layers. The BAW device 100 may be part of a larger integrated circuit that is not shown. The layers form a stack 102 that results in a rise proximate the region where the BAW device 100 is located. An acoustic resonator 106 is formed within the stack 102. In the example of FIG. 1, the resonator 106 includes an aluminum nitride (AlN) layer 110 sandwiched between a top electrode 112, which may be formed from molybdenum and a bottom electrode 114, which also may be formed from molybdenum. The top and bottom electrodes 110 and 112 are layers fabricated within the stack 102. The layers described herein are sometimes referred to as films. In the example of FIG. 1, an oxide layer 116 is located between the top electrode 112 and the AlN layer 110 and serves as a temperature compensation layer for the resonator 106. In some embodiments, the BAW device 100 does not include the oxide layer 116. Sound waves bounce between the top electrode 112 and the bottom electrode 114 so as to resonate within the resonator 106.

The stack 102 includes an upper Bragg mirror 120 and a lower Bragg mirror 122. The Bragg mirrors 120 and 122 prevent energy from escaping from the resonator 106 and serve to achieve other resonator specifications as are know in the art. The lower Bragg mirror 122 is formed by a plurality of alternating layers or films, which in the example of FIG. 1 are alternating layers of titanium tungsten and oxide. The lower Bragg mirror 122 of FIG. 1 has a first oxide layer 130 that is adjacent the bottom electrode 114 and extends the length of the BAW device 100. A first titanium tungsten layer 132 is located between the first oxide layer 130 and a second oxide layer 134. The second oxide layer 134, like the first oxide layer 130 extends the length of the BAW device 100. A second titanium tungsten layer 136 is located between the second oxide layer 134 and a third oxide layer 138. A substrate (not shown) is located underneath the third oxide layer 138 and is a material, such as silicon, on which the BAW device 100 is fabricated. Both the first titanium tungsten layer 132 and the second titanium tungsten layer 136 are located beneath the resonator 106 and terminate proximate the edges of the resonator 106. In some embodiments, an aluminum nitride seed layer (not shown in FIG. 1) is located between the first oxide layer 130 and the bottom electrode 114.

The upper Bragg mirror 120 is formed from a plurality of alternating layers that are similar or identical to the layers forming the lower Bragg mirror 122. In the example of FIG. 1, the upper Bragg mirror 120 includes a first oxide layer 140 that is located adjacent the upper electrode 112 and extends the length of the BAW device 100. The BAW device 100 has two connectors 142 and 144 that are connectable to circuits that are not shown in FIG. 1. The connectors 142 and 144 are shown as cut away views and they may be relatively small. Accordingly, portions of the oxide layers in the upper Bragg mirror 120 extend around the connectors 142 and 144. A first titanium tungsten layer 146 is sandwiched between the first oxide layer 140 and a second oxide layer 148. The second oxide layer 148 extends the length of the BAW device 100. A second titanium tungsten layer 150 is sandwiched between the second oxide layer 148 and a third oxide layer 152. The third oxide layer 152 also extends the length of the BAW device 100. The first titanium tungsten layer 146 and the second titanium tungsten layer 150 terminate at the edges of the resonator 106.

Figure 3:
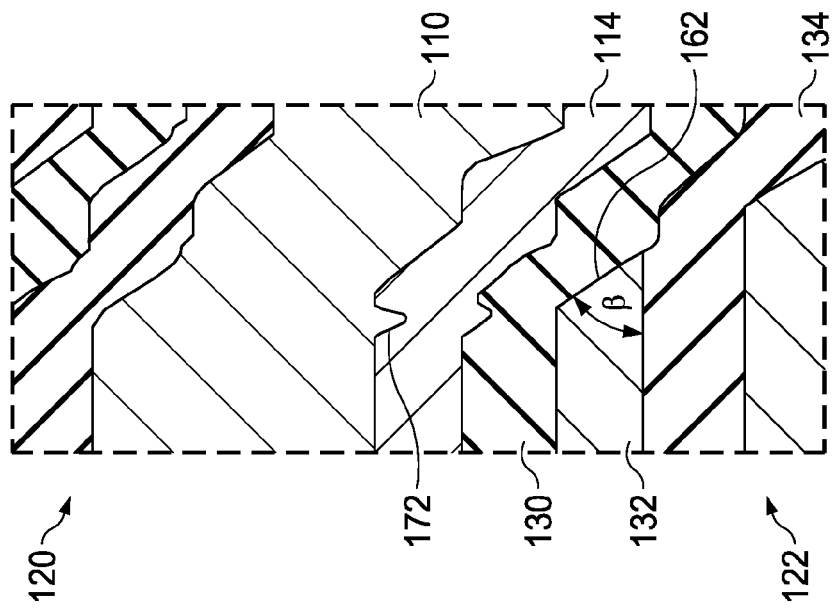
FIG. 3 is an expanded view of another molybdenum termination of FIG. 1.
Figure 2:
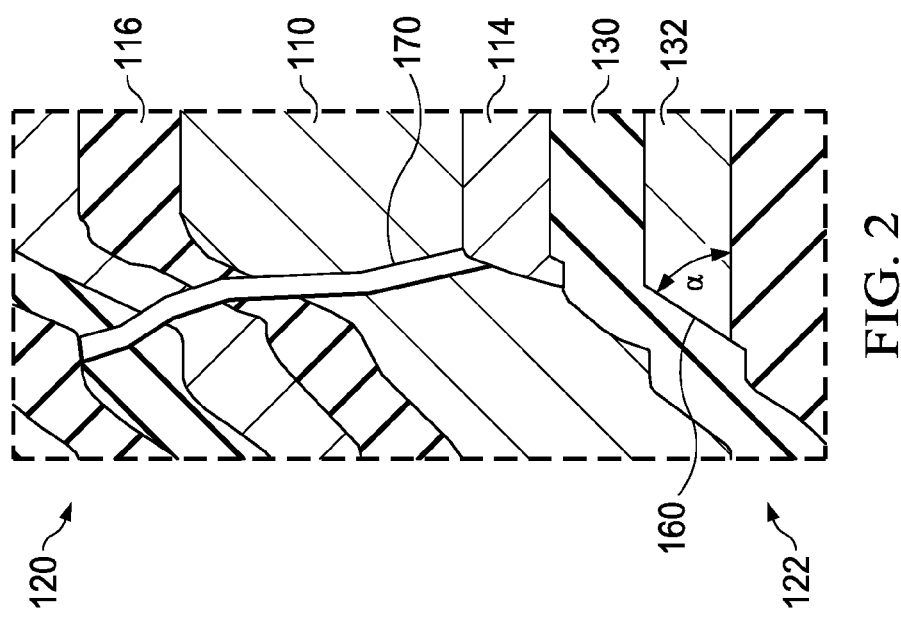
FIG. 2 is an expanded view of a molybdenum termination of FIG. 1.

The titanium tungsten layers have terminations. The first titanium tungsten layer 132 in the lower Bragg mirror 122 has a first termination 160 and a second termination 162. The terminations 160 and 162 are representative of all the terminations in all the titanium tungsten layers. In conventional devices, the terminations 160 and 162 are fabricated using conventional fabrication techniques that result in steep termination angles. In addition to being generally steep, the termination angles at the terminations 160 and 162 cannot be maintained to be constantly fabricated within a predetermined range or below a predetermined angle. FIG. 2 is an expanded view of the termination 160 and FIG. 3 is an expanded view of the termination 162. The angle α is the termination angle at the termination 160. As shown in FIG. 2, the termination angle α is approximately seventy degrees and may range between forty and ninety degrees. Referring to FIG. 3, the termination angle β at the termination 162 is also approximately seventy degrees and may range between forty and ninety degrees. The fabrication methods described herein reduce the termination angles α and β to less than a predetermined angle, such as thirty degrees, to prevent the formation of cracks and seams in the layers of the BAW device 100. In some embodiments, the termination angles α and β are between twelve and thirty-two degrees. It has been found that large termination angles in the molybdenum layers result in seams and/or cracks forming in the layers of the BAW device 100.

FIGS. 1-3 show the effects of the steep termination angles α and β at the terminations 160 and 162 of the first titanium tungsten layer 132. A crack 170 has formed from the termination 160 and extends through the first oxide layer 130, the AlN layer 110, and into the upper Bragg mirror 120. In addition, a seam 172 has formed above the termination 162 in the first titanium layer 132. The crack 170 and the seam 172 interfere with the resonator 106 and the Bragg mirrors 120 and 122, which may change the resonance and quality of acoustic waves resonating within the resonator 106. Furthermore, the crack 170 and the seam 172 can lead to discontinuities of the top molybdenum electrode 112 between the resonator 106 and electrical contact 142. Accordingly, the crack 170 and/or the seam 172 can cause the BAW device 100 to fail depending on where the crack 170 and/or the seam 172 are located. It is noted that cracks and seams may be located proximate any of the titanium tungsten terminations in the BAW device 100 or on other devices where a titanium tungsten layer terminates at a steep angle.

The devices described herein are not as susceptible to cracking and seam formation as conventional devices because the fabrication techniques maintain the termination angles in the titanium tungsten layers at less than a predetermined value, which may be twelve to thirty-two degrees. It has been found that termination angles of thirty-two degrees or less at the terminations of titanium tungsten layers reduce the likelihood that cracks and/or seams will occur in stacks. Conventional titanium tungsten layer terminations are fabricated using metal dry or wet etch processes, which cause terminations that have steep angles, such as great than seventy degrees. Some processes use a metal wet etch technique, but the technique produces inconsistent termination angles that could be greater than thirty-two degrees. The processes described herein result in termination angles in titanium tungsten layers that are consistently less than a predetermined value such as thirty degrees or thirty-two degrees.

Figure 4:
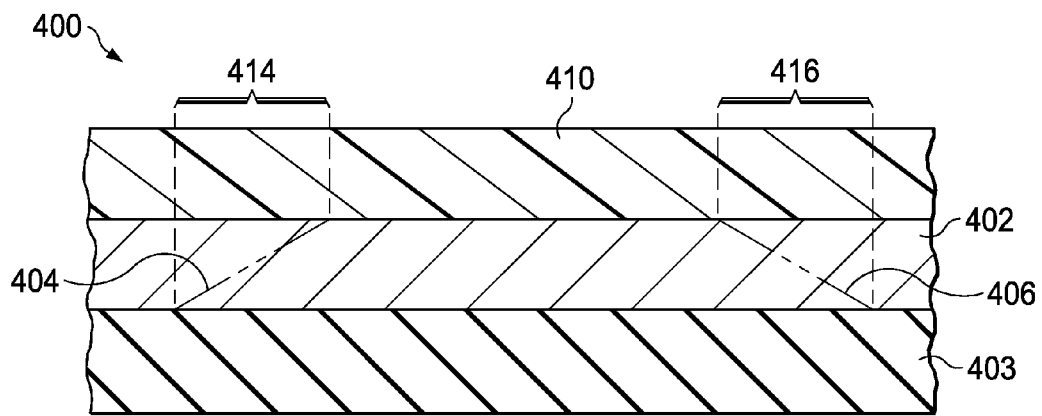
FIG. 4 is a side view of a device in the process of being fabricated.

FIG. 4 is a side view of a device 400 in the process of being fabricated. The fabrication process described herein primarily pertains to fabrication of titanium tungsten layers, so the process commences with a first titanium tungsten layer 402 fabricated onto an oxide layer 403. With regard to the BAW device 100 of FIG. 1, the titanium tungsten layer 402 corresponds to the titanium tungsten layer 136 and the oxide layer 403 corresponds to the oxide layer 138. Dashed lines in the titanium tungsten layer 402 indicate terminations 404 and 406 that will be fabricated or etched into the titanium tungsten layer 402. The thickness of the titanium tungsten layer 402 varies depending on the type of device in which the titanium tungsten layer 402 is located. In some examples, the titanium tungsten layer 402 is approximately 300-500 nm.

A photo resist layer 410 is fabricated onto the titanium tungsten layer 402. The etching process described below etches the photo resist layer 410 faster than the titanium tungsten layer 402. For example, the photo resist layer 410 may etch about four times faster than the titanium tungsten layer 402 when both are exposed to the same etching material as described below. After application of the photo resist layer 410, a photolithography step is performed on the device 400 wherein the photo resist layer 410 is exposed under defocus conditions to produce resist slope edges 414 and 416 in the photo resist layer 410 proximate the terminations 404 and 406. In some embodiments, the defocus is approximately +17 um or −17 um. In other examples, the defocus is between +/−11 um and +/−22 um to achieve the desired termination angle in the finished molybdenum layer 402. More specifically, the defocus occurs in the resist slope edges 414 and 416.

Figure 5:
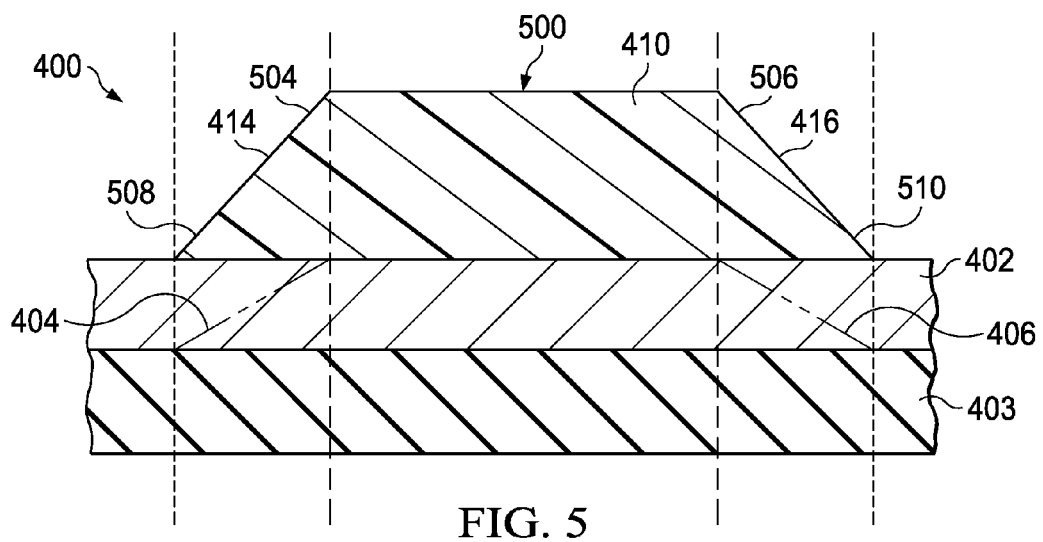
FIG. 5 is a side view of the device of FIG. 4 after the application of a photolithography step and removal of residual portions of a photo resist layer.

Reference is made to FIG. 5, which is a view of the device 400 after the application of the photolithography step and removal of residual portions of the photo resist layer 410. The photolithography step creates a resist mask 500 from the photo resist layer 410, wherein portions of titanium tungsten layer 402 covered by the resist mask 500 will not be etched or will be etched proportional to the thickness of the resist mask 500 covering the titanium tungsten layer 402 during a subsequent etching step.

The photo resist layer 410 shown in FIG. 5 has been processed during the photolithography step to remove residual photo resist material in the photo resist layer 410 that was not exposed. The resulting photo resist layer 410 is the resist mask 500. As shown in FIG. 5, the resist mask 500 has resist sloped edges 414 and 416 that are located above the portions of the molybdenum layer 402 that will be the above-described sloped terminations 404 and 406. The defocus in the photolithography applied to the photo resist layer 410 establishes the slopes of the resist sloped edges 414 and 416, which determines the termination angles in the final molybdenum layer 402 as described above. In conventional fabrication techniques, the resist is exposed at best focus conditions to provide an approximately vertical resist sidewall, which yields the steep termination angles in the conventional titanium tungsten layers.

The defocus in the photolithography step generated the resist slope edges 414 and 416. The etching materials that etch the molybdenum layer 402 consume some of the resist mask 500 during the etching process. However, the resist slope edges 414 and 416 of the resist mask 500 are thinner than the other portions of the resist mask 500 and are less resistant to the etching materials, so they are consumed faster. Additional reference is made to FIG. 6, which is a view of the device 400 of FIG. 5 after etching. The thicker inner portions 504 and 506 of the resist slope edges 414 and 416 are consumed slower than the thinner outer edges 508 and 510 of the resist slope edges 414 and 416. The result is etching of the titanium tungsten layer 402 proximate the outer portions 508 and 510 of the slope edges 414 and 416 being etched more than the inner portions 504 and 506, which results in the terminations 404 and 406 of the titanium tungsten layer 402 having the desired termination angles 610 and 612. In some embodiments, a defocus of positive or negative 17 um on a 3.5 um photo resist layer 410 generates twenty-eight degree termination angles 610 and 612. In some embodiments, the termination angles 610 and 612 are less than thirty-two degrees, which reduces the likelihood of cracks and seams being created in the device in which the titanium tungsten layer 402 is located.

In some embodiments, the etching of the device 400 includes placing the device 400 with the resist mask 500 fabricated thereon into a plasma etch chamber where portions of the titanium tungsten layer 402 not masked by the resist mask 500 are etched. As described above, the portion of the titanium tungsten layer 402 covered by the resist mask 500 will not be fully etched. However, the resist slope edges 414 and 416 will be partially etched as described above to yield the predetermined termination angles 610 and 612. In some embodiments, the etching process is performed with a flowing gas mixture containing boron trichloride and sulfur hexafluoride gas into an etching chamber. It has been found that a 1.60:1 ratio of boron trichloride to sulfur hexafluoride further enables above-described termination angles 610 and 612 to be formed into the titanium tungsten layer 402. More specifically, the boron trichloride and sulfur hexafluoride mixture etches the photo resist layer 410, so that the termination angles 610 and 612 are formed proximate the resist slope edges 414 and 416. In some embodiments, the boron trichloride to sulfur hexafluoride gas ratio is between 1.25:1 and 1.80:1. The process also yields substantially straight terminations 404 and 406 rather than curved terminations.

The etching process may further use a low transformer coupled plasma (TCP RF) at approximately 175 W. In some embodiments, the power is between 155 W and 190 W. A bias RF having a peak voltage of approximately −175 peak volts, or a peak voltage of between −150V and −185V may be applied to the device 400 during etching. The combination of the defocus, gas ratio, and the RF enables the molybdenum layer 402 to have the termination angles 610 and 612 of thirty degrees or less consistently.

At the gas ratio and/or RF power described above, the etch step terminates by an endpoint. A timed overetch step may be followed using the same processes that clean molybdenum residues. After the molybdenum layer 402 is etched, the device 400 may be placed into a plasma ash chamber where an ashing process is applied to the resist mask 500 using the chamber occurs. In some processes, the device 400 is heated to a temperature of about 175° C. to perform a plasma ash process with flowing oxygen gas into the ash chamber. The ash is controlled by endpoint and followed timed over-ash to remove any photo resist residues.

Figure 6:
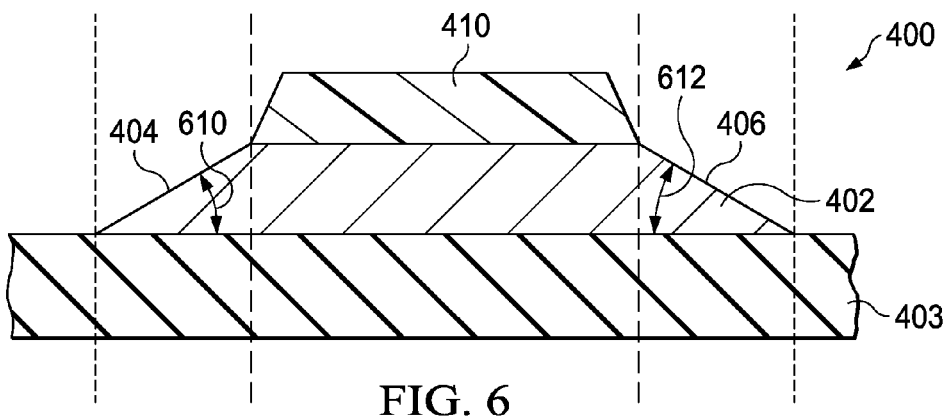
FIG. 6 is a view of the device of FIG. 5 after etching.

The resulting termination angles 610 and 612 are illustrated in FIG. 6. The termination angle 610 in FIG. 6 corresponds to the angle α from FIG. 2 and the angle 612 corresponds to the angle β of FIG. 3. The termination angles 610 and 612 are within a predetermined value, which in the examples described herein is less than thirty-two degrees. The low termination angles 610 and 612 prevent the above-described cracks and seams from forming proximate the terminations 404 and 406. All of the titanium tungsten layers in the device 400 may be fabricated as described above to prevent the above-described steep termination angles.

Different variations of the above described methods may be implemented in the fabrication processes. For example, the photo resist material 410 may be approximately 5.5 um thick. With the photo resist material 410 being 5.5 um thick and the defocus at +/−17 um, the termination angles 710 and 712 may be approximately 28 degrees to 30 degrees. In some embodiments, the termination angles 610 and 612 are maintained within one percent across the device on which the molybdenum layer 402 is located.

Figure 7:
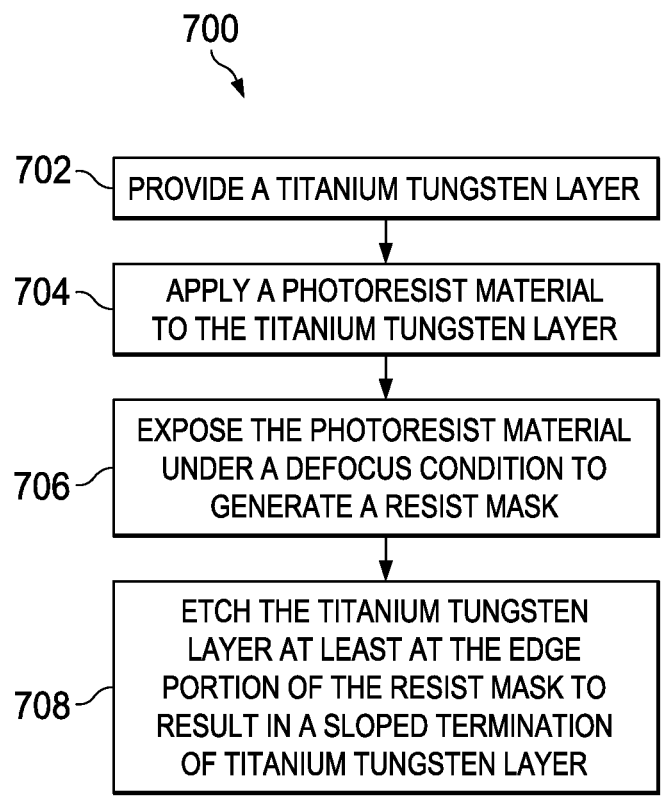
FIG. 7 is a flow chart describing a method of fabricating a titanium tungsten layer.

An embodiment of the fabrication processes described above is illustrated in the flow chart 700 of FIG. 7. The process commences at step 702 with providing a titanium tungsten layer. Referring to FIG. 4, the provided titanium tungsten layer may be the titanium tungsten layer 402 that is fabricated onto the oxide layer 403. At step 704, a photo resist material is applied to the titanium tungsten layer. The photo resist material may be the photo resist layer 410 described with reference to FIG. 4. In step 706, the photo resist material is exposed under a defocus condition to generate a resist mask. The resist mask may correspond to the mask 500 and an edge of the exposed photo resist material may correspond to one of either of the slope edges 414 or 416. In step 708, at least the edge portion of the titanium tungsten layer is etched at the edge portion of the resist mask to result in a sloped termination in the titanium tungsten layer.

Figure 8:
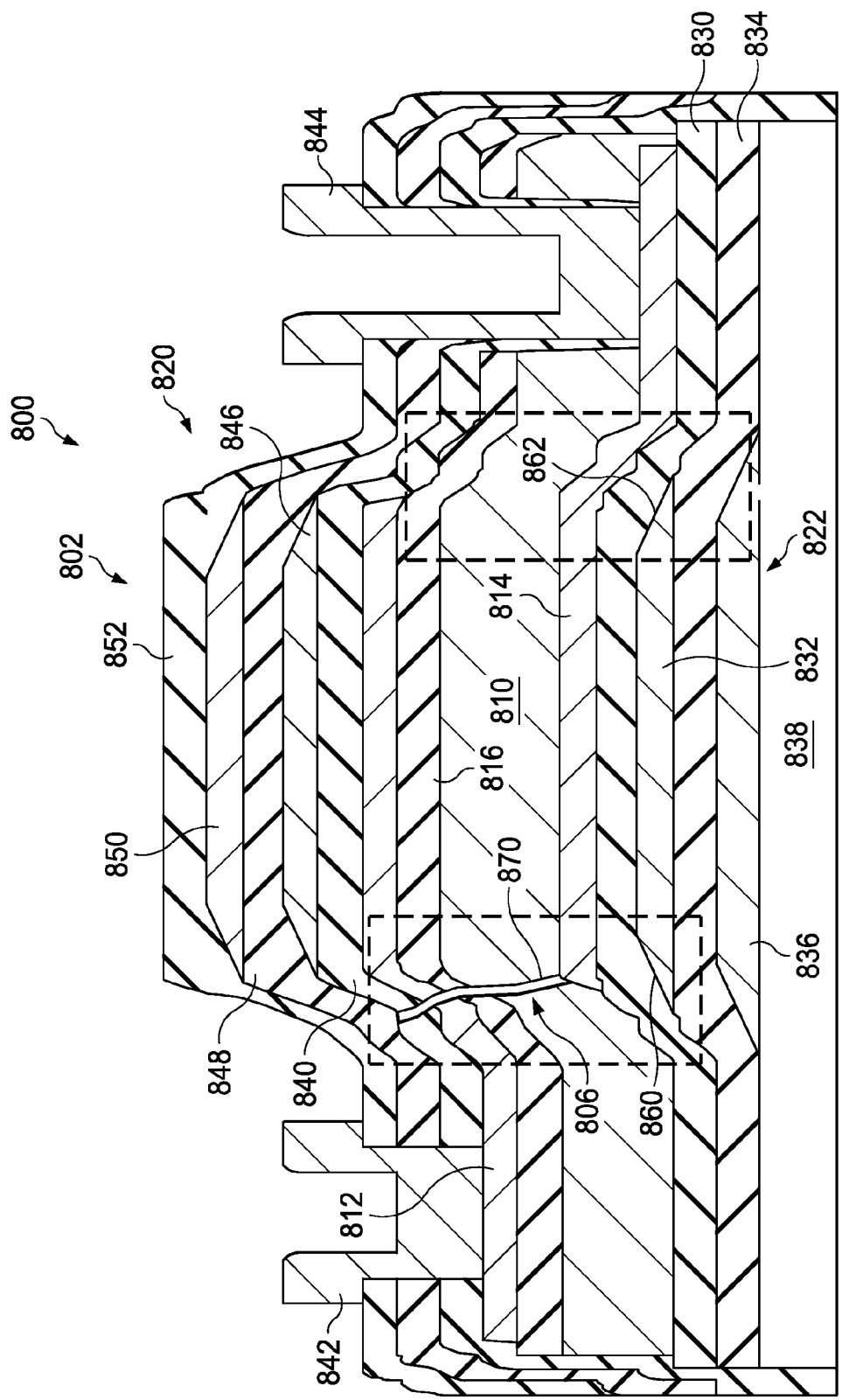
FIG. 8 is an example of an aluminum nitride piezo-based (BAW) device that is similar to the device 100 of FIG. 1, but fabricated from a plurality of layers, including titanium tungsten layers fabricated per the techniques described in FIGS. 4-7

FIG. 8 is an example of an aluminum nitride piezo-based (BAW) device 800 that is similar to the device 100 of FIG. 1, but fabricated from a plurality of layers, including titanium tungsten layers fabricated per the techniques described in FIGS. 4-7. More specifically, the titanium tungsten layers have terminations that are less than thirty-two degrees. The layers form a stack 802 that results in a rise proximate the region where the BAW device 800 is located. An acoustic resonator 806 is formed within the stack 802. The resonator 806 includes an aluminum nitride (AlN) layer 810 sandwiched between a top electrode 812, which may be formed from molybdenum and a bottom electrode 814, which also may be formed from molybdenum. In the example of FIG. 8, an oxide layer 816 is located between the top electrode 812 and the AlN layer 810 and serves as a temperature compensation layer for the resonator 806.

The stack 802 includes an upper Bragg mirror 820 and a lower Bragg mirror 822 that functions similar to the Bragg mirrors 120 and 122 of FIG. 1. The lower Bragg mirror 822 is formed by a plurality of alternating layers or films, which in the example of FIG. 8 are alternating layers of titanium tungsten and oxide. The lower Bragg mirror 822 has a first oxide layer 830 that is adjacent the bottom electrode 814 and extends the length of the device 800. A first titanium tungsten layer 832 is located between the first oxide layer 830 and a second oxide layer 834. A second titanium tungsten layer 836 is located between the second oxide layer 834 and a third oxide layer 838. A substrate (not shown) is located underneath the third oxide layer 838 and is a material, such as silicon, on which the BAW device 800 is fabricated. Both the first titanium tungsten layer 832 and the second titanium tungsten layer 836 are located beneath the resonator 806 and terminate proximate the edges of the resonator 806. In some embodiments, an aluminum nitride seed layer (not shown in FIG. 8) is located between the first oxide layer 830 and the bottom electrode 814.

The upper Bragg mirror 820 is formed from a plurality of alternating layers that are similar or identical to the layers forming the lower Bragg mirror 822. The upper Bragg mirror 820 includes a first oxide layer 840 that is located adjacent the upper electrode 812 and extends the length of the BAW device 800. The BAW device 800 has two connectors 842 and 844 that are connectable to circuits that are not shown in FIG. 8. A first titanium tungsten layer 846 is sandwiched between the first oxide layer 840 and a second oxide layer 848. A second titanium tungsten layer 850 is sandwiched between the second oxide layer 848 and a third oxide layer 852. The first titanium tungsten layer 846 and the second titanium tungsten layer 850 terminate at the edges of the resonator 806.

The titanium tungsten layers 832, 836, 846, and 850 have terminations that are less than thirty-two degrees. The first titanium tungsten layer 832 in the lower Bragg mirror 822 has a first termination 860 and a second termination 862. The terminations 860 and 862 are representative of all the terminations in all the titanium tungsten layers. By using the techniques described above, the termination angles at the terminations 860 and 862 can be maintained to be constantly fabricated within a predetermined range or below a predetermined angle. For example, the termination angles are less than to thirty-two degrees, which alleviates the above-described problems caused by large termination angles.

While some examples of fabrication methods have been described in detail herein, it is to be understood that the inventive concepts may be otherwise variously embodied and employed and that the appended claims are intended to be construed to include such variations except insofar as limited by the prior art.

What is claimed is:

1. A method of forming a termination angle in a titanium tungsten layer in a semiconductor, the method comprising:
   providing a titanium tungsten layer;
   applying a photo resist material to the titanium tungsten layer;
   exposing the photo resist material under a defocus condition to generate a resist mask having an edge portion;
   etching the titanium tungsten layer at least at the edge portion of the resist mask to result in a sloped termination of the titanium tungsten layer; and
   forming an oxide layer on the titanium tungsten layer wherein the oxide layer covers the termination angle.

2. The method of claim 1, wherein providing a titanium tungsten layer comprises forming a titanium tungsten layer on an oxide layer.

3. The method of claim 1, wherein the termination angle is less than thirty-two degrees.

4. The method of claim 1, wherein the termination angle is between twenty-eight degrees and thirty-two degrees.

5. The method of claim 1, wherein the etching comprises exposing the titanium tungsten layer and the photo resist material to a gas comprising boron trichloride and sulfur hexafluoride.

6. The method of claim 5, wherein the ratio of boron trichloride to sulfur hexafluoride is between 1.25:1 and 1.80:1.

7. The method of claim 1, wherein the ratio of boron trichloride to sulfur hexafluoride is approximately 1.60:1.

8. The method of claim 1, wherein the defocus is between +/−15 um and +/−25 um.

9. The method of claim 1, wherein the defocus is either approximately +17 um or approximately −17 um.

10. The method of claim 1, wherein the etching comprises applying a low transformer coupled plasma between 150 watts and 200 watts.

11. The method of claim 1, wherein the etching comprises applying a low transformer coupled plasma at approximately 175 watts.

12. The method of claim 1, wherein the etching comprises applying a bias RF of between −125 peak volts and −185 peak volts.

13. The method of claim 1, wherein the etching comprises applying a bias RF of approximately −150 peak volts.

14. A method of fabricating a titanium tungsten layer in a bulk acoustic wave device, the method comprising:
   providing the titanium tungsten layer;
   applying a photo resist material to the titanium tungsten layer;
   exposing the photo resist material under a defocus condition to generate a resist mask, an edge of the exposed photo resist material corresponding to a region of the titanium tungsten layer that is to become the sloped termination; and
   etching the titanium tungsten layer with an etching material having boron trichloride and sulfur hexafluoride, wherein the etching material at least partially etches the resist mask exposed under the defocused condition, the etching resulting in the sloped termination in the titanium tungsten layer.

15. The method of claim 14, wherein the ratio of boron trichloride to sulfur hexafluoride is between 1.25:1 and 1.80:1.

16. The method of claim 14, wherein the ratio of boron trichloride to sulfur hexafluoride is approximately 1.60:1.

17. The method of claim 14, wherein the defocus is between +/−15 um and +/−25 um.

18. The method of claim 14, wherein the defocus is either approximately +17 um or approximately −17 um.

19. The method of claim 14, wherein the etching comprises applying a low transformer coupled plasma at approximately 175 watts.

20. The method of claim 14, wherein the etching comprises applying a bias RF of between −125 peak volts and −185 peak volts.

21. The method of claim 14, wherein the etching comprises applying a bias RF of approximately −150 peak volts.

22. A method fabricating a titanium tungsten layer in a bulk acoustic wave device, the method comprising:
   providing a titanium tungsten layer fabricated onto an oxide layer;
   applying a photo resist material to the titanium tungsten layer;
   exposing the photo resist material under a defocus condition of +17 um or −17 um to generate a resist mask, an edge of the exposed photo resist material corresponding to the sloped termination; and
   etching the titanium tungsten layer with an etching material having trichloride and sulfur hexafluoride in a ratio of approximately 1.60:1, wherein the etching comprises applying a low transformer coupled plasma at approximately 175 watts and a bias RF of approximately −150 peak volts, wherein the etching material at least partially etches the photo resist material exposed under the defocused condition, the etching resulting in the sloped termination in the titanium tungsten layer.

23. A semiconductor device comprising:
   a plurality of layers, wherein at least one of the plurality of layers is a titanium tungsten layer; and
   a termination at one end of the titanium tungsten layer, wherein the termination angle at the termination is less than thirty-two degrees.

* * * * *